United States Patent [19]

Nakagawa et al.

[11] Patent Number: 4,766,477
[45] Date of Patent: Aug. 23, 1988

[54] SEMICONDUCTOR DEVICE INCLUDING A SEMICONDUCTOR LAYER HAVING A POLYCRYSTALLINE SILICON FILM WITH SELECTED ATOMIC CONSTITUENCY

[75] Inventors: Katsumi Nakagawa, Tokyo; Toshiyuki Komatsu, Yokohama; Yoshiyuki Osada, Yokosuka; Satoshi Omata, Tokyo; Yutaka Hirai, Tokyo; Takashi Nakagiri, Tokyo, all of Japan

[73] Assignee: Canon Kabushiki Kaisha, Tokyo, Japan

[21] Appl. No.: 885,336

[22] Filed: Jul. 11, 1986

Related U.S. Application Data

[63] Continuation of Ser. No. 494,049, May 12, 1983, abandoned.

[30] Foreign Application Priority Data

May 17, 1982 [JP] Japan .................... 57-82651

[51] Int. Cl.⁴ .................... H01L 29/04; H01L 29/78
[52] U.S. Cl. .................... 357/59; 357/2; 357/4; 357/23.7; 148/DIG. 122
[58] Field of Search .................... 357/2, 4, 23.7, 59 E; 148/DIG. 122

[56] References Cited

U.S. PATENT DOCUMENTS 4,239,554 12/1980 Yamazaki .................... 357/2
4,351,856 9/1982 Matsui et al. .................... 357/59
4,498,092 2/1985 Yamazaki .................... 357/59
4,539,283 9/1985 Shirai et al. .................... 357/2
4,668,969 5/1987 Yamazaki .................... 357/23.7

FOREIGN PATENT DOCUMENTS 7900776 10/1979 PCT Int'l Appl. .................... 357/59

OTHER PUBLICATIONS

Applied Physics Letters, Makino et al, vol. 35, pp. 551-552, Oct. 1, 1979.
Applied Physics Letters, Matsui et al, vol. 37, pp. 936-937, 1980.
Applied Physics Letters, Ginley, vol. 39, pp. 624-626, Oct. 15, 1981.
Kamins et al, IEEE Electron Device Letters, "Hydrogenation . . . Films", vol. EDL-1, No. 8, Aug. 1980, pp. 159-161.

Primary Examiner—Andrew J. James
Assistant Examiner—Jerome Jackson
Attorney, Agent, or Firm—Fitzpatrick, Cella, Harper & Scinto

[57] ABSTRACT

A semiconductor device mainly comprises a semiconductor layer of a polycrystalline silicon film containing at least one atom selected from the group consisting of carbon, sulfur, nitrogen and oxygen as a constituent.

20 Claims, 3 Drawing Sheets

1

SEMICONDUCTOR DEVICE INCLUDING A SEMICONDUCTOR LAYER HAVING A POLYCRYSTALLINE SILICON FILM WITH SELECTED ATOMIC CONSTITUENCY

This application is a continuation of application Ser. No. 494,049, filed May 12, 1983, now abandoned.

BACKGROUND OF THE INVENTION

1. Field of the Invention

This invention relates to a semiconductor element such as a field effect thin film transistor, and the like, and more particularly to a semiconductor element of which the main part is constituted of a polycrystalline silicon thin film semiconductor layer.

2. Description of the Prior Art

Recently, for constructing a scanning circuit portion of an image reading device for use in image reading, such as a one-dimensional photosensor made in a continuous length or a two-dimensional photosensor of an enlarged area, or for constructing a driving circuit of an image display device utilizing liquid crystal (abbreviated as LC); electrochromic material (abbreviated as EC) or electroluminescence material (abbreviated as EL), it has been proposed to form a field effect thin film transistor by using as the base material a silicon thin film formed on a certain substrate, corresponding in size to the increased area of such display portions.

Such a silicon thin film is desired to be polycrystalline rather than amorphous for realization of a large scale image reading device or image display device to improve speed and function. In spite of the desirability of increasing that the effective carrier mobility ($\mu$eff) of a silicon thin film as a base material for formation of a scanning circuit portion of such a high speed, high function reading device or driving circuit portion, the amorphous silicon thin film obtained by the ordinary discharge decomposition method is at most 0.1 cm$^2$/V.sec., which is by far inferior to MOS type transistors of single crystalline silicon. The small carrier mobility ($\mu$eff) due to the Hall mobility in amorphous silicon and a large change with lapse of time are inherent characteristics of an amorphous silicon thin film, and therefore, amorphous silicon thin films can not take advantage of the ease of preparation and low production costs offered by polycrystalline thin films.

In contrast, a polycrystalline silicon thin film has a Hall mobility by far greater than that of an amorphous silicon thin film as can be seen from measured data. Theoretically, it is quite probable that a polycrystalline silicon thin film may be prepared with an even larger value of mobility ($\mu$eff) than that presently obtained.

In the prior art, various methods for preparing a polycrystalline silicon film over a large area on a given substrate are well known, such as Chemical Vapour Deposition (CVD) method, Low Pressure Chemical Vapour Deposition (LPCVD) method, Molecular Beam Epitaxy (MBE) method, Ion Plating (IP) method, Glow Discharge (GD) method, etc.

According to any one of these methods, it has been known that it is possible to prepare a polycrystalline silicon film on a substrate of a large area although the substrate temperature may differ depending on the methods.

However, under the present state of the art, a semiconductor element or a semiconductor device with its main part constituted of a semiconductor layer of a polycrystalline silicon thin film prepared by these methods cannot exhibit sufficiently desired characteristics and reliability.

SUMMARY OF THE INVENTION

An object of the present invention is to provide a semiconductor element or device of which the main part is constituted of a polycrystalline thin film layer having desirable behavior characteristics and reliability of a semiconductor device.

Another object of the present invention is to provide a semiconductor element of a semiconductor device having excellent semiconductor properties and reliability.

A further object of the present invention is to provide a semiconductor element of which the main part is constituted of a polycrystalline silicon semiconductor layer containing at least one atom selected from the group consisting of carbon, sulfur, nitrogen and oxygen atoms.

According to the present invention, there is provided a semiconductor element which comprises a semiconductor layer of a polycrystalline silicon which maintains values within specific ranges of: the concentration of hydrogen atoms, the etching rate for the semiconductor layer, the unevenness of surface layer, and the orientation and crystal size of the polycrystal.

According to a further aspect of the present invention, there is provided a semiconductor element of which the main part is constituted of a polycrystalline thin film layer containing at least one atom as constituents selected from the following group: carbon, sulfur, nitrogen and oxygen atoms.

DESCRIPTION OF THE PREFERRED EMBODIMENTS

Figure 1:
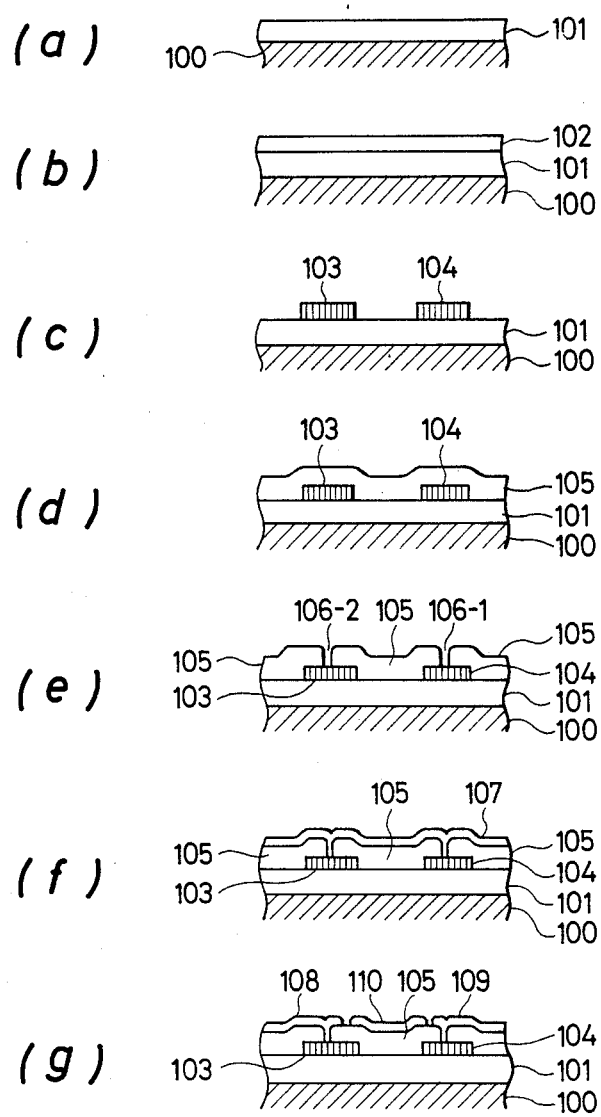
FIGS. 1 (*a*) through (*g*) shows a schematic flow sheet illustrating the steps for preparation of the semiconductor elements according to the present invention.

The process for preparation of TFT according to the one embodiment of the present invention is illustrated by reference to FIG. 1 (a) through (g).

The TFT is a field effect transistor which comprises semiconductor layer 101, electrode layer 107, ohmic contact layers 103 and 104, and insulating layer 105, and is modulated by the bias voltage applied to the gate electrode 110 disposed on the insulating layer 105.

A voltage is applied between the source electrode 108 and the drain electrode 109 provided adjacent to the semiconductor layer 101 and having ohmic contacts, and the current passing therebetween is modulated by the bias voltage applied to the gate electrode 110 provided on the insulating layer 105 (the structure is shown in FIG. 1, Step (g)). First, after the substrate 100 is washed, a polycrystalline silicon thin film 101 is deposited thereon according to a thin film forming technique as stated hereinbelow (Step (a)). Details of the deposition method are described herein in respective Examples. Then, as the ohmic layer, an n+ (phosphorus-doped silicon) layer 102 is deposited, the source and drain are formed by etching (Step (c)) and thereafter an insulating layer 105 is deposited thereon (Step (d)). The insulating layer is constituted of a material such as silicon nitride, $SiO_2$, $Al_2O_3$, and the like formed by CVD, LPCVD, etc.

Next, the contact holes 106 for the source and drain electrodes are opened (Step (e)) and the upper electrode gate, the source and the drain are wired (Steps (f) and (g)) to complete the transistor.

The semiconductor layer of polycrystalline silicon according to the present invention contains at least one atom selected from carbon, sulfur, nitrogen and oxygen atoms. These constituents may be two or more.

When carbon is contained in a polycrystalline silicon of the present invention, the amount of carbon atoms may be 0.01–5 atomic %, preferably 0.03–5 atomic %. The amount of sulfur atoms may be 0.01–5 atomic %, preferably 0.03–5 atomic %, when the layer contains sulfur. The amount of nitrogen atoms may be 0.01–5 atomic %, preferably 0.01–4 atomic %, when the layer contains nitrogen. The amount of oxygen atoms may be 0.03–5 atomic %, preferably 0.03–4 atomic %, when the layer oxygen.

The drawbacks above are completely overcome by constituting the above atoms to form a semiconductor device having excellent semiconductor properties with high reliability, which utilizes the thus formed polycrystalline silicon layer.

It is preferable that the polycrystalline silicon contain hydrogen, according to the semiconductor device of the present invention. The hydrogen content in the polycrystalline silicon is preferably 0.01 to 3 atomic % and the maximum of the surface unevenness of the formed semiconductor layer is also preferably substantially 800 Å or less. Furthermore, it is preferable to form a semiconductor layer so as to have an etching rate of 20 Å/sec. or less by the etchant which comprises a hydrofluoric acid (50 vol. % aqueous solution), nitric acid (d=1.38, 60 vol. % aqueous solution) and glacial acetic acid at a volume ratio of 1:3:6.

In the present invention, the object of the present invention can be accomplished even more effectively by making the polycrystalline silicon thin film semiconductor layer constituting the main part of the semiconductor element in such a manner that its X-ray or electron beam diffraction pattern has a diffraction intensity from the plane of the plane index (220) of 30% or more of the diffraction intensity (total diffraction intensity). In addition, the thin film semiconductor layer has an average crystal particle size of 200 Å or more.

In the present invention, the method for examining the orientation characteristics, the X-ray diffraction and the electron beam diffraction are performed in combination.

The X-ray diffraction intensity of a polycrystalline silicon film prepared was measured by X-ray diffractometer produced by Rigaku Denki (copper tube bulb, 35 KV, 10 mA) and a comparison was made. The diffraction angle 2 $\theta$ was varied from 20° to 65°, and diffraction peaks at plane indices of (111) plane, (220) plane and (311) were detected to determine their diffraction intensities.

Electron beam diffraction intensities were measured by JEM-100 V produced by Nippon Denshi Co., and respective diffraction intensities were determined similarly.

According to the ASTM card (No. 27-1402, JCPDS, 1977), in case of a polycrystalline silicon having no orientation at all, taking out only (220) from the planes in terms of (h, k, l) representation with large diffraction intensities of (111):(220):(311)=100:55:30, its ratio to the total diffraction intensities, namely the diffraction density of (220)/(total diffraction density) is equal to $(55/241) \times 100 \approx 22.8$ (%).

With the use of this value as the standard, an orientation characteristic (220) with a greater value than the above percentage, especially 30% or more, can give further improved transistor characteristics. At a value less than 30%, the change with lapse of time becomes undesirably greater. For the value of the diffraction density in terms of the above percentage representation, 50% or more is most preferred.

Further, it has been also found that transistor characteristics, especially carrier mobility, can be improved by increasing the average grain size and satisfying the requirements of the hydrogen (H) content in the polycrystalline silicon thin film and its surface unevenness characteristic as specified above. The value of the average grain size was determined according to the conventionally used Scherrer method from the half-value width of the (220) peak in the X-ray diffraction pattern as described above. The effective carrier mobility can be increased perticularly at an average grain size of 200 Å or more.

By incorporating at least one of the above stated conditions into those of the present invention as constituents, the semiconductor layer of the polycrystalline silicon having a higher specific resistance ($\rho$) and a smaller optical absorption coefficient ($\alpha$) may be formed on the substrate, and may be useful as a semiconductor device in many fields of the art.

For example, while in the n-channel type field effect thin film transistor (FE-TFT) which is prepared with a polycrystalline silicon thin film according to the prior known process, the "off" drain current ($I_{off}$) at a low gate voltage often cannot be made low enough when compared to the "on" drain current ($I_{on}$) at a high gate voltage, the semiconductor of the present invention never suffers from such drawback.

When a read-out portion and a driving circuit portion in a read-out element, or an image displaying portion and a scanning circuit portion in an image display element, are integrated into a single unit and a main part of the driving circuit portion or scanning circuit portion is composed of a polycrystalline silicon thin film, these circuit portions are usually exposed to a light from outside thereof.

Since the semiconductor device according to the present invention has a remarkably small optical absorption coefficient, these drawbacks may be neglected in practice. Thus, a circuit having superior circuit properties may be obtained provided that a main part of the circuit is composed of a semiconductor device of the present invention.

The semiconductor layer of the polycrystalline silicon of which the main part of the semiconductor device of the present invention is composed may be formed on a desired substrate as follows.

A silane gas such as $SiH_4$, $Si_2H_6$, $Si_3H_8$, $Si_4H_{10}$ and the like, diluted to a desired concentration with hydrogen and dilute gas such as He, Ar, Kr and the like, together with raw gases containing atoms to be incorporated into a semiconductor layer to be formed, are introduced into a vacuum deposition chamber for forming the layer, whereupon glow discharge is effected.

For instance, use is made of hydrocarbons such as methane ($CH_4$), ethane ($C_2H_6$), propane ($C_3H_8$), ethylene ($C_2H_4$) and the like, tetra fluoro methane ($CF_4$), tetra methylsilane (($CH_3)_4Si$), tetre ethylsilane (($C_2H_5)_4Si$) and the like for carbons to be contained into the semiconductor layer.

Use is made of hydrogen sulfide (HS), hexa fluoro sulfide ($SF_6$) and the like for sulfur atoms, oxygen ($O_2$), water ($H_2O$) and the like for oxygen atoms, and nitrogen ($N_2$), ammonium ($NH_3$), NO, $NO_2$, $N_2O$ and the like for nitrogen atoms as raw gases.

The semiconductor layer of the polycrystalline silicon may be prepared according to a sputtering process, wherein a target containing atoms to be incorporated into the formed semiconductor layer, as well as a target of silicon, may be used in so-called "co-sputtering process", or sputtering is effected on the silicon target by introducing the above mentioned raw gases on demand in the so-called "reaction sputtering process" and the like.

Measurement of the percentage of the various atoms in the semiconductor layer of the polycrystalline silicon of the present invention was conducted according to following processes.

Analysis for carbon and sulfur was conducted by means of a simultaneous analytical apparatus for carbon and sulfur in metal (Model CS-46 Type, produced by Leco), and analysis for oxygen and nitrogen was conducted by means of a simultaneous analytical apparatus for oxygen and nitrogen in metal (Model TC-36 type, produced by Leco). A conventional procedure was followed in those analytical method. That is, after deposition of silicon on a Pt substrate in an amount of approx. 10 mg, the substrate was fixed on a holder in the analytical apparatus, and the weight of the atomic elements was measured and from which content of atoms was calculated in terms of atomic %.

The optical absorption coefficient ($\alpha$) of the semiconductor film was determined by means of automatic recording spectrophotometer (Model 323 type, produced by Hitachi Ltd.).

In general, the optical absorption coefficient is determined by a point of intersection on an abscissa with a formula of $\sqrt{\alpha h\nu} - h\nu$ (wherein $h\nu$ represents the energy of light used, to obtain an end point of absorption Eo, wherein data may be extrapolated from a straight line part of the formula. The result of the present invention was chosen from the data obtained at $\lambda=550$ nm as representative (abbreviated as $\alpha$ (550)).

The change over a lapse of time of the polycrystalline silicon thin film transistor for showing the effect of the present invention was performed according to the method described below.

Figure 2:
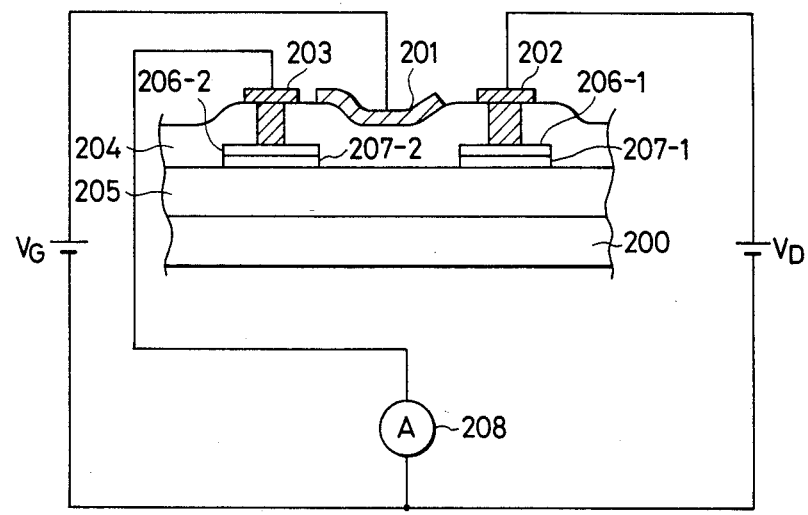
FIG. 2 shows a schematic view illustrating the circuit for measurement on the Thin Film Transistor (TFT) characteristics.

A TFT having a structure shown in FIG. 2 was prepared, and by applying a gate voltage $V_G=40$ V to the gate 201 and a drain voltage $V_D=40$ V between the source 203 and the drain 202, the drain current $I_D$ flowing between source 203 and drain 202 was measured by an electrometer (Keithley 610 C electrometer) to determine the change of the drain current with a lapse of time. The percentage of the change with a lapse of time was determined by dividing the change of drain current after 500 hours of continuous running by the initial drain current and multiplying the value obtained by 100 so as to be represented in %.

According to a method conventionally conducted in MOS FET (metal oxide semiconductor field effect transistor), the threshold voltage $V_{TH}$ of the TFT was defined as the point at which the line extrapolated from the straight line portion in $V_D-\sqrt{I_D}$ curve crosses over the abscissa of $V_D$. The changes in $V_{TH}$ before and after the change with lapse of time were examined at the same time and the changed quantity was represented in volts.

The polycrystalline silicon film was a semiconductor of n type and had an electric resistance of $\cong 10^8$ $\Omega\cdot$cm.

Subsequently, the TFT was prepared according to the process of the present invention with the film thus formed. In order to improve the ohmic contact between source and drain of TFT, the formation of n+ silicon layer is prepared while maintaining the temperature of the substrate at 180° C. $PH_3$ gas diluted with hydrogen gas to 100 vol ppm (abbreviated as ($PH_3(100$ ppm)$/H_2$)) and $SiH_4$ diluted with the present invention is described in detail below by way of Examples.

EXAMPLE 1

Figure 3:
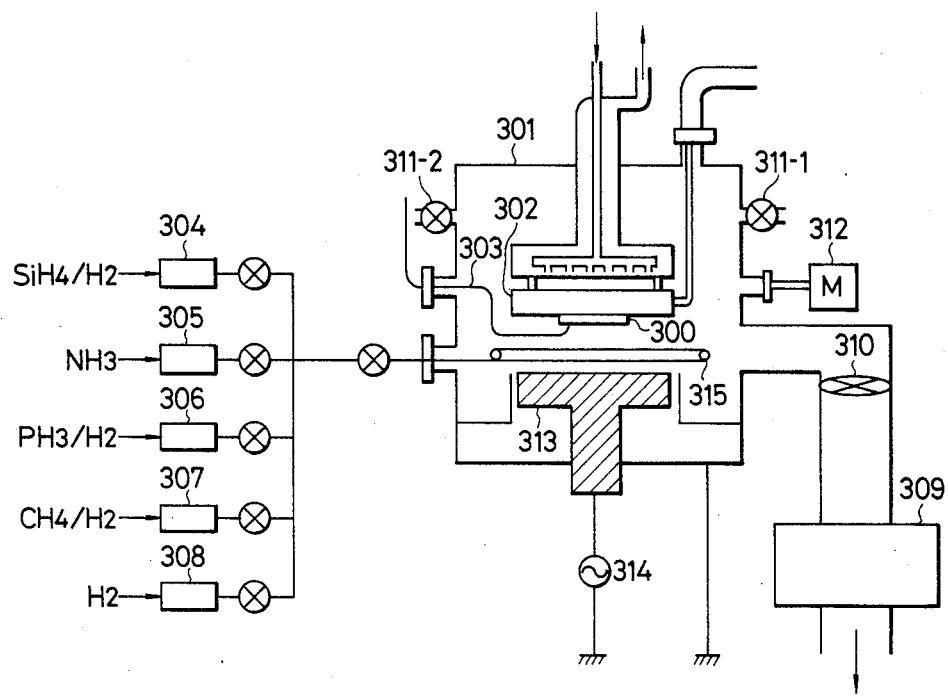
FIG. 3 shows a schematic drawing of one embodiment apparatus for preparing silicon film which is used for a semiconductor according to the present invention.

According to the procedure shown below, a polycrystalline silicon thin film was formed on a substrate and a field effect type transistor (TFT) was prepared with the use of said thin film. The polycrystalline silicon thin film was formed with the apparatus illustrated in FIG. 3, wherein the substrate 300 used is Corning glass #7059 having 0.5 mm of thickness.

First, the substrate 300 was washed, lightly etched with a mixture of $HF/HNO_3/CH_3COOH$, and dried. The substrate 300 was fixed in close contact with the substrate heating holder 302 (area: 452 cm$^2$) on the upper anode side in a bell-jar deposition chamber 301. The bell-jar was evacuated by means of a diffusion pump 309 to a background vacuum of $2 \times 10^{-7}$ Torr. When evacuation is not sufficient reactant gases are not effectively used for film formation, and in addition, the reproductivity of film characteristics is lost. The evacuation process, thus required special care. The substrate 300 was then heated to maintain the surface temperature at 500° C. (The temperature was controlled by means of thermocouple 303). After cleaning a surface of the substrate 300 by introducing $H_2$ gas into the bell-jar 301 under control of a mass-flow controller 308, a reactant gas was introduced. The surface temperature Ts of the substrate was adjusted to 350° C. and the inside pressure in the bell-jar was controlled to 0.2 Torr on discharge.

In the Example, the reactant gases used were $SiH_4$ gas diluted to 10 vol. % with $H_2$ gas (abbreviated as "$SiH_4(10)/H_2$") and methane gas ($CH_4$) diluted to 0.5 vol. % with $H_2$ gas (abbreviated as "$CH_4(0.5)/H_2$").

Flow rate of each gas was controlled to 5 SCCM by gas-flow controllers 304 and 307, and the inner pressure in the bell-jar was controlled to a desired pressure by means of an absolute pressure gauge 312 by closing the main valve 310. After the inner pressure in the bell-jar was stabilized, a voltage of 0.7 KV was applied by the high frequency power source 314 of 13.56 MHz on the lower cathode electrode 313 to excite glow discharge. The current was 60 mA, with RF discharging power being 20 W.

Under the same conditions, the discharge was continued for 30 minutes to complete formation of a film, and the discharge and introduction of gases was stopped.

The substrate was cooled to 180° C. and maintained there for a subsequent process. The film thus formed on the substrate ws 3000 Å in thickness and had a thickness distributed within the range of ±10% for the substrate having 3"×3" dimensions, wherein the gases were intorduced from nozzles of the circular ring type.

The polycrystalline silicon film was n type and had an electric resistance of ≃18²Ω·cm.

Subsequently, the thin film transistor was prepared according to the process shown in the FIG. 1 (a) through (g) using the thus formed polycrystalline silicon film. An n+ silicon layer was prepared by the following procedure while maintaining substrate temperature at 180° C. so as to obtain excellent ohmic contact of source.drain in TFT. PH$_3$ gas diluted with hydrogen gas to 100 vol ppm (abbreviated as (PH$_3$(100 ppm)/H$_2$)) and SiH$_4$ gas diluted with hydrogen gas to 10 vol. % (abbreviated as (SiH$_4$(10)/H$_2$)) were introduced to the bell-jar 301 at a molar ratio of PH$_3$(100 ppm)/H$_2$ relative to the SiH$_4$(10)/H$_2$ to adjust the inner pressure in the bell-jar at 0.12 Torr, whereupon glow discharge was effected at 10 W to form the n+ layer 102 doped with P to a thickness of 500 Å (Step (b)). Then, according to the Step (c), the n+ layer was removed by photoetching except for the region for the source electrode 103 and the region for the drain electrode 104. Again, the above substrate was fixed on the heating holder 302 on the anode side in the bell-jar 301 so as to form a gate insulating film. Similarly as in preparation of the polycrystalline silicon, the bell-jar 301 was evacuated, the substrate temperature Ts maintained at 250° C. and NH$_3$ gas was introduced at a flow rate of 20 SCCM and SiH$_4$(10)/H$_2$ gas at a flow rate of 5 SCCM, into the bell-jar, whereupon glow discharge was excited at 5 W to deposit a SiNH film 105 to a thickness of 2500 Å.

Next, contact holes 106-2 and 106-1 for the source electrode 103 and the drain electrode 104 were opened by the photoetching step, and thereafter an electrode film 107 was formed on the entire surface of the SiNH film by vapor deposition of Al, followed by working of the Al electrode film 107 by the photoetching step to form the lead-out electrode 108 for the source 109 and the gate electrode 110. Thereafter, heat treatment was conducted at 250° C. in H$_2$ atmosphere. The TFT (channel length L=10μ, channel width W=650 μ) formed according to the process under the conditions as described above was found to exhibit stable and good characteristics.

Figure 4:
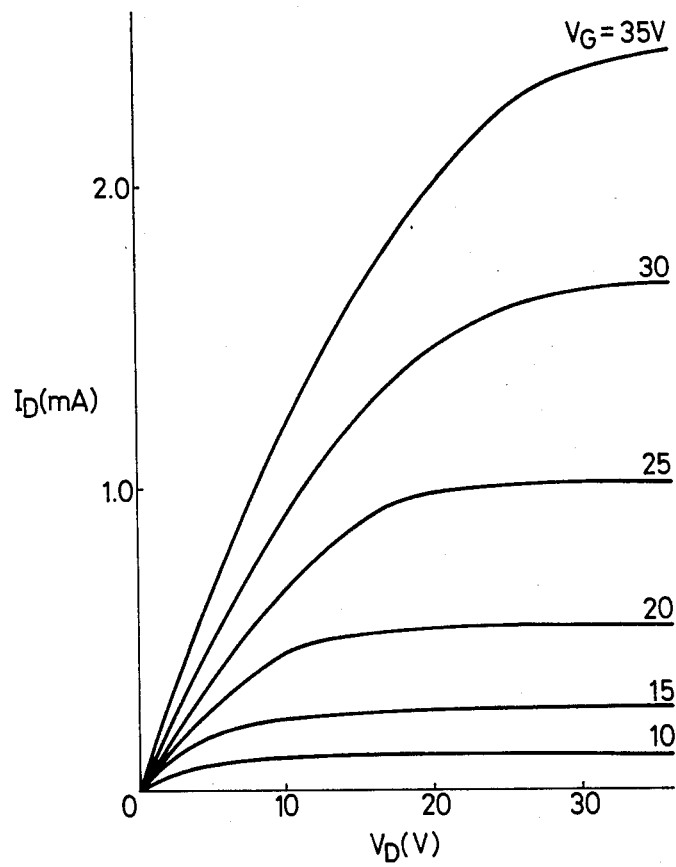
FIG. 4 shows graphical data depicting the TFT properties of the present invention.

FIG. 4 shows exemplary characteristics of the thus prepared TFT e.g. the relationship between the drain current I$_D$ and the drain voltage V$_D$ with the gate voltage V$_G$ being changed as a parameter. The threshold voltage (Vth) of the gate is as low as 5 V, and the ratio of the current value at V$_G$=20 V to that at V$_G$=0 can be a number of 4 or more figures.

The hydrogen content of the polycrystalline silicon film which was used for the preparation of TFT and the optical absorption at the wavelength of 550 nm (abbreviated as α(550)) were measured according to the above method and the results are shown on the Table 1 below. In the table, the results are shown in terms of various flow rates of CH$_4$ gas diluted with hydrogen at 5 SCCM according to the embodiment of the present invention, and at 0, 2, 10, and 20 SCCMs, under the same condition other than flow rate thereof.

An effective carrier mobility (μeff) of the TFTs which were prepared using these polycrystalline films, and a ratio of drain current I$_D$(20) at a gate voltage (Vg) of 20 V, with respect to drain current I$_D$(0) at a gate voltage of 0 (abbreviated as on/off ratio) are shown in the same Table 1.

From Table 1, it may be understood that the carbon content can be about 0.01 atomic % or more in practical operation.

As clearly seen from Table 1, α and the on/off ratio can be effectively changed by increasing the concentration of carbon up to about 10% while keeping μeff>1.

While Corning #7059 glass was used as substrate in the Example, superhard glass or silica glass was also used as substrate under a higher treating temperature and substrate temperature to obtain similar properties. Accordingly, since the substrate temperature Ts may be freely chosen within a vast range, from lower to higher temperature, a storage circuit of TFT can be easily prepared cheaper, and with a more convenient apparatus.

TABLE 1

| Sample No. | 1-1 | 1-2 | 1-3 | 1-4 | 1-5* |
|---|---|---|---|---|---|
| x (SCCM) | 0.1< | 2 | 5 | 10 | 20 |
| Carbon content (atomic %) | 0.01< | 2.1 | 4.5 | 8.3 | 12.4 |
| α (550) | 4 × 10⁴ | 2.7 × 10⁴ | 1.4 × 10⁴ | 9.0 × 10³ | 2.0 × 10⁴ |
| μeff (cm²/V · sec) | 8.0 | 7.6 | 6.0 | 1.2 | 0.02 |
| (on/off) ratio | 9.0 × 10² | 4.2 × 10³ | 1.2 × 10⁵ | 1.3 × 10⁴ | 2.0 × 10² |

*Sample No. 1-5 was amorphous.

| | |
|---|---|
| Gas flow rate of SiH$_4$(3) | 5 SCCM |
| Gas flow rate of CH$_4$(0.5)/H$_2$ | x SCCM |
| Discharge power | 20 W |
| Pressure | 0.05 Torr |
| Substrate temperature (Ts) | 500° C. |

EXAMPLE 2

By repeating the procedure employed in Example 1, except that SF$_6$ gas, diluted to 0.2 vol. % with H$_2$ gas (abbreviated as "SF$_6$(0.2)/H$_2$"), flowed at a gas flow rate of 0, 2, 5, 10 and 20 SCCM, respectively, together with SiH$_4$(3)/H$_2$ gas, silicon thin films on the substrates were produced. Then the thin film layers were used to produce TFT's in the same manner as in Example 1 and were measured in the same way as in Example 1. The results are shown in Table 2.

Table 2 indicates that the concentration of S can be controlled in practice at about 0.01 atomic % or more and α and the on/off ratio can be effectively changed by increasing the concentration of S up to about 5 atomic % while keeping μeff>1.

TABLE 2

| Sample No. | 2-1 | 2-2 | 2-3 | 2-4 | 2-5 |
|---|---|---|---|---|---|
| x (SCCM) | 0 | 2 | 5 | 10 | 20 |
| Concentration of S (atomic %) | <0.01 | 0.8 | 2.1 | 4.3 | 8.2 |
| α (550) | 4 × 10⁴ | 3.4 × 10⁴ | 2.8 × 10⁴ | 2.5 × 10⁴ | 2.1 × 10⁴ |
| μeff (cm²/V · sec) | 8.0 | 7.2 | 2.0 | 0.9 | 0.1 |
| (on/off) ratio | 9.0 × 10² | 7.5 × 10³ | 2.3 × 10⁴ | 8.2 × 10² | 1.2 × 10² |

| | |
|---|---|
| Gas flow rate of SiH$_4$(3)/H$_2$ | 5 SCCM |
| Gas flow rate of SF$_6$(0.5)/H$_2$ | x SCCM |
| Discharge power | 20 W |
| Pressure | 0.05 Torr |
| Substrate temperature (Ts) | 500° C. |

EXAMPLE 3

By repeating the procedure employed in Example 1 except that oxygen was introduced into the bell-jar through a variable leak valve before flowing $SiH_4(3)/H_2$, a silicon thin film layer was formed on a substrate. Since the flow rate of oxygen is so small, the control was effected by measuring. Table 3 indicates that the concentration of oxygen can be about 0.03 atomic % or more in practical operation and $\alpha$ and the on/off ratio can be effectively changed by increasing the concentration of oxygen up to about 5 atomic % while keeping $\mu eff > 1$.

TABLE 3

| Sample No. | 3-1 | 3-2 | 3-3 | 3-4 | 3-5* |
|---|---|---|---|---|---|
| x (Torr) | 0.0 | 0.2 | 0.5 | 1.0 | 2.0 |
| Oxygen content (atomic %) | 0.03 | 0.9 | 2.3 | 5.1 | 8.3 |
| $\alpha$ (550) | $4 \times 10^4$ | $2.3 \times 10^4$ | $1.2 \times 10^4$ | $6.0 \times 10^3$ | $5.0 \times 10^3$ |
| $\mu eff$ (cm²/V · sec) | 8.0 | 3.1 | 1.4 | 0.8 | 0.005 |
| (on/off) ratio | $9.0 \times 10^2$ | $1.8 \times 10^4$ | $1.6 \times 10^4$ | $2.3 \times 10^3$ | $5.6 \times 10^2$ |

*Sample No. 3-5 was amorphous.

| | |
|---|---|
| Gas flow rate of $SiH_4(3)/H_2$ | 5 SCCM |
| Discharging Power | 20 W |
| Pressure | 0.05 Torr |
| Substrate Temperature (Ts) | 500° C. |

EXAMPLE 4

Silicon thin film were prepared on a substrate according to the same method used in Example 1 except that $N_2$ gas was flowed at five flow rates: 0 SCCM, 2 SCCM, 5 SCCM, 10 SCCM, and 20 SCCM simultaneously with $SiH_4(3)/H_2$ gas during the formation of the silicon thin films.

Five TFT were prepared by use of the silicon thin films thus prepared in the same manner used in Example 1, and the same tests as described in Example 1 were carried out for the five samples to obtain the results as shown in Table 4.

Based on Table 4, it was found that the nitrogen content in practice can be about 0.01 atomic % or more. Further, $\alpha$ and the on/off ratio could be effectively changed while keeping $\mu eff > 1$ by increasing the nitrogen content to about 5 atomic %.

TABLE 4

| Sample No | 4-1 | 4-2 | 4-3 | 4-4 | 4-5 |
|---|---|---|---|---|---|
| x (SCCM) | 0.0 | 2.0 | 5.0 | 10.0 | 20.0 |
| Nitrogen content (atomic %) | 0.01 | 1.5 | 3.7 | 6.2 | 10.1 |
| $\alpha$ (550) | $4 \times 10^4$ | $2.8 \times 10^4$ | $1.5 \times 10^4$ | $7.4 \times 10^3$ | $4.5 \times 10^3$ |
| $\mu eff$ (cm²/V · sec) | 8.0 | 4.8 | 2.3 | 1.1 | 0.2 |
| (on/off) ratio | $9.0 \times 10^2$ | $3.7 \times 10^3$ | $9.5 \times 10^4$ | $5.7 \times 10^4$ | $2.6 \times 10^3$ |

| | |
|---|---|
| Gas flow rate of $SiH_4(3)/H_2$ | 5 SCCM |
| Gas flow rate of Nitrogen | x SCCM |
| Discharging Power | 20 W |
| Pressure | 0.05 Torr |
| Substrate Temperature (Ts) | 500° C. |

What we claim is:

1. A semiconductor device which comprises a semiconductor layer of a polycrystalline silicon film containing as a constituent at least one atom selected from the group consisting of carbon, sulfur, nitrogen and oxygen, the semiconductor layer having an X-ray diffraction pattern or an electron beam diffraction pattern of which the orientation strength at the (220) plane is 30% or more based on the total orientation strength, wherein said polycrystalline silicon film consists essentially of crystal grains having an average particle size of 200 Å or larger and contains hydrogen atoms in an amount of 0.01-3 atomic %.

2. A semiconductor device according to claim 1, wherein the polycrystalline silicon contains carbon atoms in an amount of 0.01-10 atomic %.

3. A semiconductor device according to claim 1, wherein the polycrystalline silicon contains sulfur atoms in an amount of 0.01-5 atomic %.

4. A semiconductor device according to claim 1, wherein the polycrystalline silicon contains nitrogen atoms in an amount of 0.01-5 atomic %.

5. A semiconductor device according to claim 1, wherein the polycrystalline silicon contains oxygen atoms in an amount of 0.03-5 atomic %.

6. A semiconductor device according to claim 1, wherein the polycrystalline silicon contains hydrogen atoms in an amount of 3 atomic % or less.

7. A semiconductor device according to claim 1, wherein the semiconductor layer of a polycrystalline silicon film has a maximum surface unevenness of substantially not more than 800 Å.

8. A semiconductor device according to claim 1, wherein the semiconductor layer of a polycrystalline silicon film has etching rate of 20 Å/sec or less by an etchant comprising a hydrofluoric acid (50 vol. % aqueous solution), nitric acid (d=1.38, 60 vol. % aqueous solution) and glacial acetic acid at a volume ratio of 1:3:6.

9. A semiconductor device according to claim 1, wherein the polycrystalline silicon has an average particle size of 200 Å or larger.

10. A semiconductor device according to claim 1, wherein the polycrystalline silicon film is prepared according to a thin film forming technique.

11. A semiconductor device which comprises:
a substrate,
a semiconductor layer of a polycrystalline silicon film formed on the substrate and containing as a constituent at least one atom selected from the group consisting of carbon, sulfur, nitrogen and oxygen atoms, the semiconductor layer having an X-ray diffraction pattern or an electron beam diffraction pattern of which the orientation strength at the (220) plane is 30% or more based on the total orientation strength,
a drain region and source region formed on the surface of the semiconductor layer,
an insulating layer provided between the drain and source regions,
a gate electrode provided on the insulating layer,
a source electrode in electrical contact with the source region, and
a drain electrode in electrical contact with the drain region.

12. A semiconductor device according to claim 11, wherein the polycrystalline silicon contains carbon atoms in an amount of 0.01-10 atomic %.

13. A semiconductor device according to claim 11, wherein the polycrystalline silicon contains sulfur atoms in an amount of 0.01-5 atomic %.

14. A semiconductor device according to claim 11, wherein the polycrystalline silicon contains nitrogen atoms in an amount of 0.01-5 atomic %.

15. A semiconductor device according to claim 11, wherein the polycrystalline silicon contains oxygen atoms in an amount of 0.03-5 atomic %.

16. A semiconductor device according to claim 11, wherein the polycrystalline silicon contains hydrogen atoms in an amount of 3 atomic % or less.

17. A semiconductor device according to claim 11, wherein the semiconductor layer of a polycrystalline silicon film has a maximum surface unevenness of substantially not more than 800 Å.

18. A semiconductor device according to claim 11, wherein the semiconductor layer of a polycrystalline silicon film has etching rate of 20 Å/sec or less by an etchant comprising a hydrofluoric acid (50 vol. % aqueous solution), nitric acid (d=1.38, 60 vol. % aqueous solution) and glacial acetic acid at a volume ratio of 1:3:6.

19. A semiconductor device according to claim 11, wherein the polycrystalline silicon has an average particle size of 200 Å or larger.

20. A semiconductor device according to claim 11, wherein the polycrystalline silicon film is prepared according to a thin film forming technique.

* * * * *